(12) United States Patent
Khlat et al.

(10) Patent No.: US 9,071,210 B2
(45) Date of Patent: Jun. 30, 2015

(54) EFFICIENT POWER TRANSFER POWER AMPLIFIER (PA) ARCHITECTURE

(71) Applicant: RF Micro Devices, Inc., Greensboro, NC (US)

(72) Inventors: Nadim Khlat, Cugnaux (FR); Alexander Wayne Hietala, Phoenix, AZ (US)

(73) Assignee: RF Micro Devices, Inc., Greensboro, NC (US)

( * ) Notice: Subject to any disclaimer, the term of this patent is extended or adjusted under 35 U.S.C. 154(b) by 53 days.

(21) Appl. No.: 14/056,135

(22) Filed: Oct. 17, 2013

(65) Prior Publication Data

US 2014/0111275 A1    Apr. 24, 2014

Related U.S. Application Data

(60) Provisional application No. 61/716,179, filed on Oct. 19, 2012.

(51) Int. Cl.
| | |
|---|---|
| *H03F 1/14* | (2006.01) |
| *H03F 1/56* | (2006.01) |
| *H03F 3/20* | (2006.01) |
| *H03F 3/68* | (2006.01) |
| *H03F 3/24* | (2006.01) |

(52) U.S. Cl.
CPC .. *H03F 1/56* (2013.01); *H03F 3/20* (2013.01); *H03F 3/68* (2013.01); *H03F 3/24* (2013.01); *H03F 2200/387* (2013.01); *H03F 2200/537* (2013.01); *H03F 2200/541* (2013.01)

(58) Field of Classification Search
CPC .............................. H03F 3/72; H03F 2200/429
USPC .............. 330/51, 101, 86, 144; 455/107, 311, 455/341
See application file for complete search history.

(56) References Cited

U.S. PATENT DOCUMENTS

| | | | |
|---|---|---|---|
| 4,498,057 A | | 2/1985 | Noro |
| 5,610,553 A | * | 3/1997 | Kirn ................................ 330/10 |
| 6,389,269 B1 | * | 5/2002 | Nanni et al. ..................... 455/93 |
| 7,486,133 B2 | * | 2/2009 | Bakalski ......................... 330/51 |
| 7,728,661 B2 | * | 6/2010 | Bockelman et al. ............ 330/51 |
| 7,893,790 B2 | * | 2/2011 | Van Delden .................. 333/101 |

(Continued)

OTHER PUBLICATIONS

Notice of Allowance for U.S. Appl. No. 13/045,604, mailed May 17, 2013, 11 pages.

(Continued)

*Primary Examiner* — Sonny Trinh
(74) *Attorney, Agent, or Firm* — Withrow & Terranova, P.L.L.C.

(57) ABSTRACT

An efficient power transfer power amplifier (PA) architecture is disclosed that includes a first PA, a first impedance transformation network (ITN) coupled to the first PA, a second PA, and a second ITN coupled to the second PA. A switching network having a plurality of load outputs along with a first switch input coupled to a first impedance output of the first ITN and a second switch input coupled to a second impedance output of the first ITN, a third switch input coupled to a third impedance output of the second ITN, and a fourth switch input coupled to a fourth impedance output of the second ITN. A control system is adapted to control the switching network to switch signals at the first, second, third, and fourth switch inputs such that select ones of the signals travel paths having matching impedances to loads coupled to the plurality of load outputs.

26 Claims, 8 Drawing Sheets

(56) References Cited

U.S. PATENT DOCUMENTS

| | | | |
|---|---|---|---|
| 8,174,315 B1 * | 5/2012 | Mangold et al. | 330/195 |
| 2006/0012425 A1 | 1/2006 | Ohnishi et al. | |
| 2008/0003797 A1 | 1/2008 | Kim | |
| 2009/0180403 A1 | 7/2009 | Tudosoiu | |
| 2010/0099366 A1 | 4/2010 | Sugar et al. | |
| 2011/0241782 A1 | 10/2011 | Clifton | |
| 2011/0241787 A1 | 10/2011 | Mastovich | |
| 2012/0235735 A1 | 9/2012 | Spits et al. | |
| 2012/0320803 A1 | 12/2012 | Skarp | |

OTHER PUBLICATIONS

Non-Final Office Action for U.S. Appl. No. 13/045,621, mailed May 31, 2013, 13 pages.
Notice of Allowance for U.S. Appl. No. 13/045,621, mailed Sep. 24, 2013, 10 pages.
Notice of Allowance for U.S. Appl. No. 13/460,861, mailed Jan. 30, 2014, 9 pages.
Non-Final Office Action for U.S. Appl. No. 14/051,601, mailed May 5, 2015, 6 pages.

\* cited by examiner

EFFICIENT POWER TRANSFER POWER AMPLIFIER (PA) ARCHITECTURE

RELATED APPLICATIONS

The present application claims priority to U.S. Provisional Patent Application No. 61/716,179, filed Oct. 19, 2012, the disclosure of which is incorporated herein by reference in its entirety.

FIELD OF THE DISCLOSURE

The present disclosure relates to power amplifiers and in particular to power amplifier architecture that matches amplifier impedance with load impedance for efficient power transfer between the power amplifiers and loads.

BACKGROUND

There is a need to use multi-band power amplifiers and power management architectures that enable operation in contiguous and non-contiguous intra-band uplink carrier aggregation (UL CA). In a single phone other bands may not require operation in UL CA non-contiguous modes. In spite of this complication, power amplifier architectures should remain efficient in all modes of operation and avoid duplication of duplexers, power amplifiers, and switches. Thus, what is needed is an efficient power transfer power amplifier architecture having an ability to switch between various modes of operation while maintaining an efficient power transfer between amplifiers and loads.

SUMMARY

An efficient power transfer power amplifier (PA) architecture is disclosed that includes a first PA, a first impedance transformation network (ITN) having an input coupled to an output of the first PA, a second PA, and a second ITN having an input coupled to an output of the second PA. Also included is a switching network having a plurality of load outputs along with a first switch input coupled to a first impedance output of the first ITN and a second switch input coupled to a second impedance output of the first ITN, a third switch input coupled to a third impedance output of the second ITN, and a fourth switch input coupled to a fourth impedance output of the second ITN. A control system is adapted to control the switching network in response to a selected mode to switch signals arriving at the first, the second, the third, and the fourth switch inputs such that select ones of the signals travel paths having matching impedances to loads coupled to select ones of the plurality of load outputs.

In another embodiment, an efficient power transfer PA architecture includes a first PA, a first programmable impedance transformation network (PITN) having an input coupled to an output of the first PA, a second PA, and a second PITN having an input coupled to an output of the second PA. Also included is a switching network having a plurality of load outputs along with a first switch input coupled to an impedance output of the first PITN, and a second switch input coupled to an impedance output of the second PITN. In this particular embodiment, a control system is adapted to control the switching network in response to a selected mode to switch signals arriving at the first switch input and the second switch input to select ones of the plurality of load outputs, and to control programmable impedances of the first PITN and the second PITN such that select ones of the signals travel paths having matching impedances to loads coupled to select ones of the plurality of load outputs.

Benefits of the efficient power transfer PA architectures of the present disclosure include increased efficiency due to selective reconfiguration of load-line transformation to realize an optimization in a power amplifier's load-line. Moreover, preferred embodiments are powered by a first power supply and a second power supply, wherein one or the other of the first power supply and the second power supply can be deactivated to reduce power consumption by 50%. Another benefit of the efficient power transfer power amplifier architecture embodiments is that they reuse at least some of the existing duplexers that do not need to be duplicated, thus saving on cost and circuit periphery.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 1:
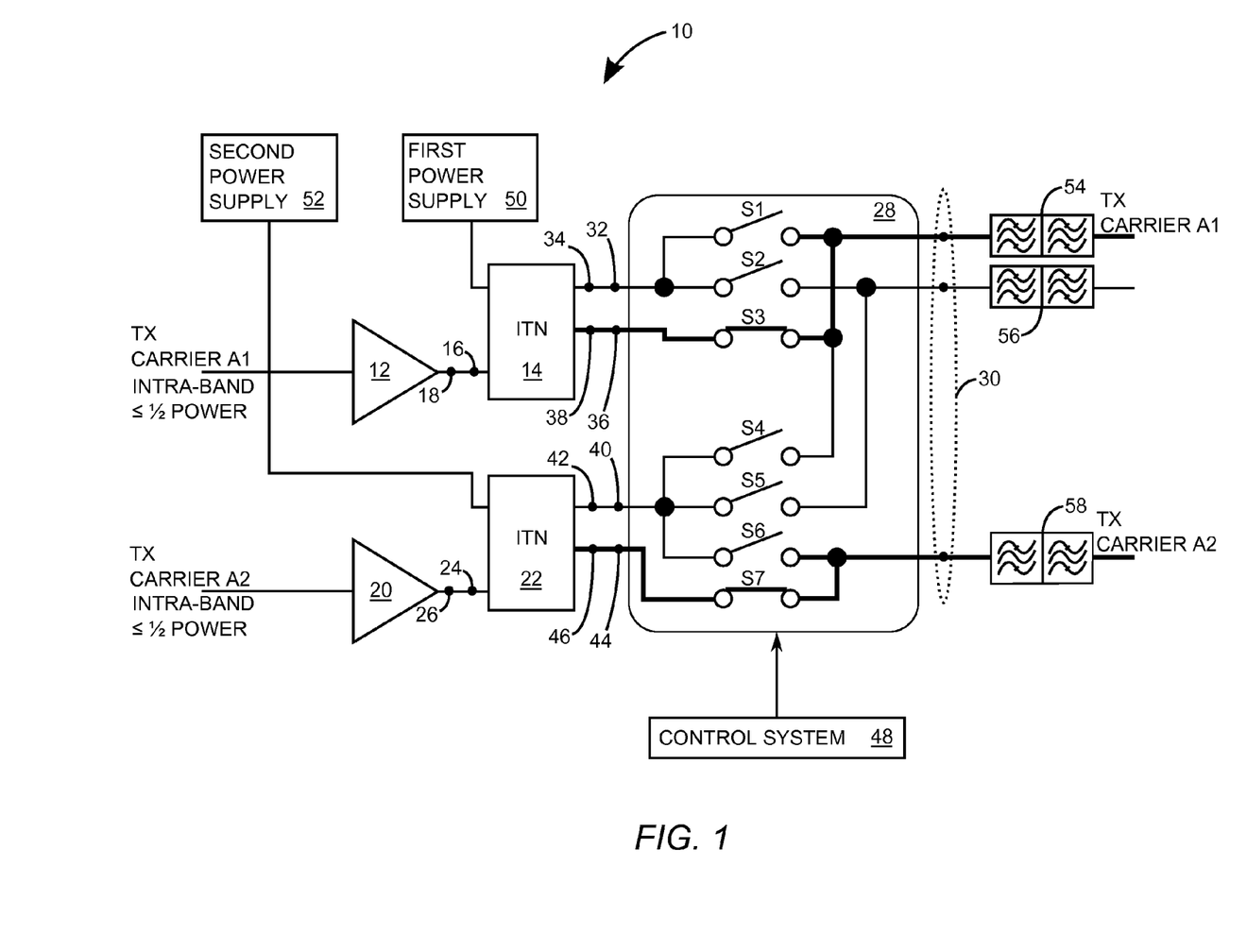
FIG. 1 is a schematic of an efficient power transfer power amplifier (PA) architecture having an impedance transformation network (ITN) that, combined with a switching network, matches an impedance of a PA to an impedance of a load.

FIG. 1 is a schematic of an efficient power transfer power amplifier (PA) architecture 10 that includes a first PA 12, a first impedance transformation network (ITN) 14 having an input 16 coupled to an output 18 of the first PA 12. Also included is a second PA 20, and a second ITN 22 having an input 24 coupled to an output 26 of the second PA 20. In at least one embodiment, the first ITN 14 and the second ITN 22 are each made up of a transformerless network configured from inductors and capacitors. In other embodiments the first ITN 14 and the second ITN 22 are radio frequency (RF) transformers used for impedance matching.

Further included is a switching network 28 having a plurality of load outputs 30 along with a first switch input 32 coupled to a first impedance output 34 of the first ITN 14 and a second switch input 36 coupled to a second impedance output 38 of the first ITN 14, a third switch input 40 coupled to a third impedance output 42 of the second ITN 22, and a fourth switch input 44 coupled to a fourth impedance output 46 of the second ITN 22. A control system 48 is adapted to control switches S1 through S7 within the switching network 28. In operation the control system 48 opens and closes select ones of switches S1 through S7 to route signals arriving at the first switch input 32, the second switch input 36, the third switch input 40, and the fourth switch input 44 such that the signals travel paths having matching impedances to loads coupled to individual ones of the plurality of load outputs 30.

In the exemplary embodiment of FIG. 1, a first power supply 50 supplies power to the first PA 12 needed for amplifying a first transmit signal (TX) carrier A1 via the first ITN 14. Similarly, a second power supply 52 supplies power to the second PA 20 needed for amplifying a second TX carrier A2. The first power supply 50 and the second power supply 52 can each be of a fast switched-mode power supply (Fast SMPS) type used in envelope tracking systems. An envelope tracking system generates an envelope tracking signal (ETS) that is used as a reference input for a Fast SMPS. In turn, the Fast SMPS uses the envelope tracking signal to modulate a supply of a power amplifier for an increased efficiency. Alternatively, the first power supply 50 and the second power supply 52 are each an average power tracking (APT) type power supply that changes DC supply levels during each power control slot time for long term evolution (LTE) signals.

Moreover, a first duplexer 54 coupled to one of the plurality of load outputs 30 is shown filtering the first TX carrier A1 as a result of an exemplary switch configuration for the switching network 28 shown in FIG. 1. An alternate switch configuration (not shown) activated by the control system 48 results in the filtering of the second TX carrier A2 through the first duplexer 54. A second duplexer 56 coupled to another one of the plurality of load outputs 30 is shown inactive. However, alternate switch configurations for the switching network 28 can be activated by the control system 48 to filter either the first TX carrier A1 or the second TX carrier A2 through the second duplexer 56. A third duplexer 58 coupled to yet another one of the plurality of load outputs 30 filters the second TX carrier A2. It is to be understood that the first PA 12 and the second PA 20 can each be a half PA cell that makes up a full PA. As a result, each of the first power supply 50 and the second power supply 52 can be considered a half power supply that supplies one half the total power delivered to a load.

Figure 2:
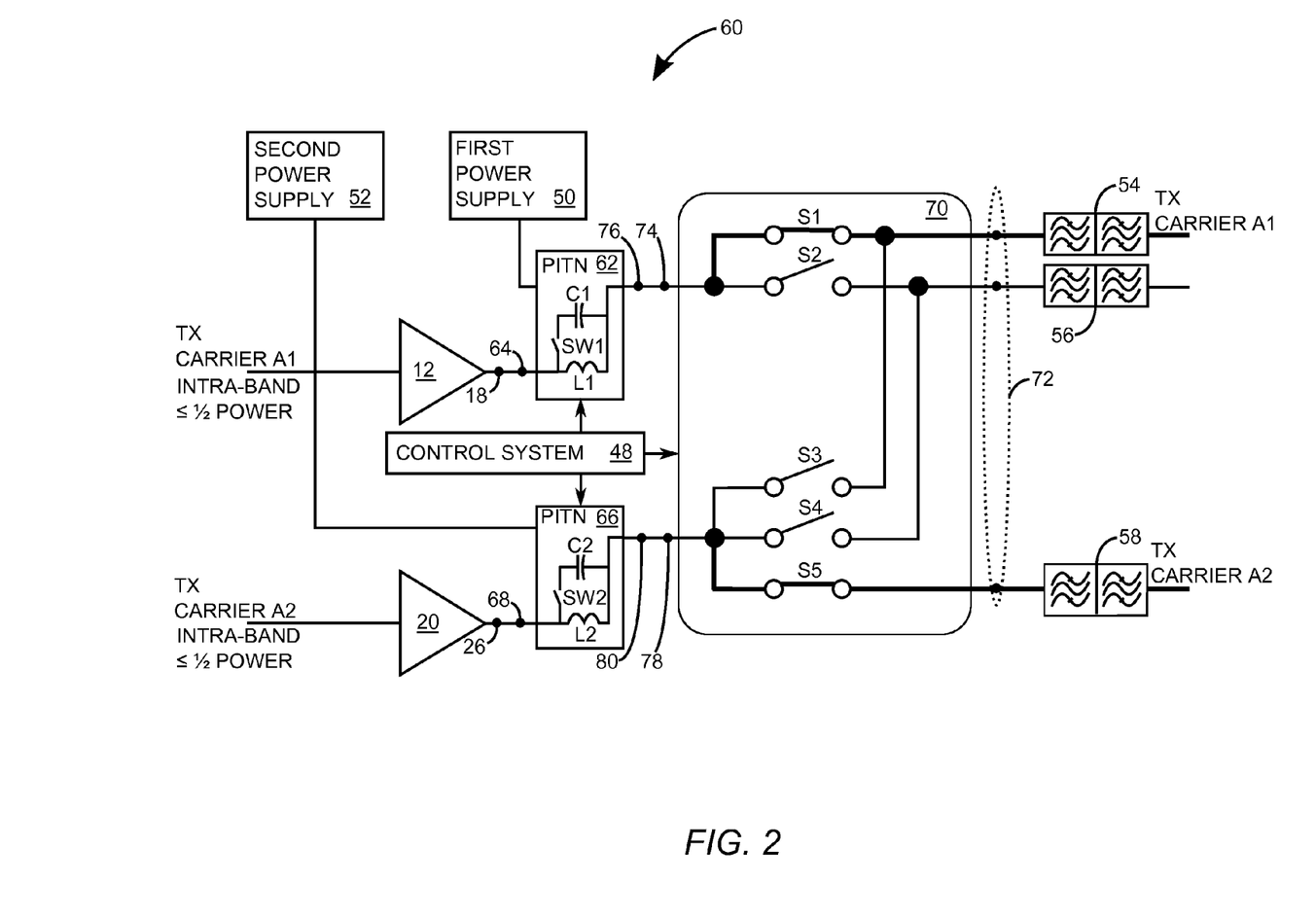
FIG. 2 is a schematic of an efficient power transfer PA architecture having a programmable impedance transformation network (PITN) that, combined with a switching network, matches an impedance of a PA with an impedance of a load.

FIG. 2 is a schematic of another efficient power transfer PA architecture 60 that includes the first PA 12, a first programmable impedance transformation network (PITN) 62 having an input 64 coupled to the output 18 of the first PA 12, the second PA 20, and a second PITN 66 having an input 68 coupled to the output 26 of the second PA 20. Also included is a switching network 70 having a plurality of load outputs 72 along with a first switch input 74 coupled to an impedance output 76 of the first PITN 62, and a second switch input 78 coupled to an impedance output 80 of the second PITN 66.

In this particular embodiment, the control system 48 is adapted to control the switching network 70. In operation, the control system 48 opens and closes select ones of switches S1 through S5 to route signals arriving at the first switch input 74 and the second switch input 78 to individual ones of the plurality of load outputs 72. The control system 48 is further adapted to control programmable impedances of the first PITN 62 and the second PITN 66 such that select ones of the signals travel paths having matching impedances to loads coupled to select ones of the plurality of load outputs 72. In the exemplary embodiment of FIG. 2, the impedance of the first PITN 62 is controlled via the control system 48 to open and close a first branch switch SW1 that alternately places a capacitor C1 in and out of parallel with an inductor L1. Similarly, the impedance of the second PITN 66 is controlled via the control system 48 to open and close a second branch switch SW2 that alternately places a capacitor C2 in and out of parallel with an inductor L2. It is to be understood that relatively more complex programmable impedance networks having pluralities of switches, capacitors, and inductors arranged in various circuit topologies can comprise the first PITN 62 and the second PITN 66. Also, during a non-CA UL mode, output power is reduced by 3 dB from a maximum output power by deactivating either the first PA 12 and the first power supply 50 or the second PA 20 and the second power supply 52.

In the exemplary embodiment of FIG. 2, the first power supply 50 supplies power to the first PA 12 needed for amplifying the first TX carrier A1 via the first PITN 62. Similarly, the second power supply 52 supplies power to the second PA 20 needed for amplifying the second TX carrier A2 via the second PITN 66. Moreover, the first duplexer 54 coupled to one of the plurality of load outputs 30 is shown filtering the first TX carrier A1 as a result of an exemplary switch configuration for the switching network 70 shown in FIG. 2. An alternate switch configuration activated by the control system 48 results in the filtering of the second TX carrier A2 through the first duplexer 54. A second duplexer 56 coupled to another one of the plurality of load outputs 72 is shown inactive. However, alternate switch configurations (not shown) for the switching network 28 can be activated by the control system 48 to filter either the first TX carrier A1 or the second TX carrier A2 through the second duplexer 56. A third duplexer 58 coupled to yet another one of the plurality of load outputs 72 filters the second TX carrier A2.

Figure 3:
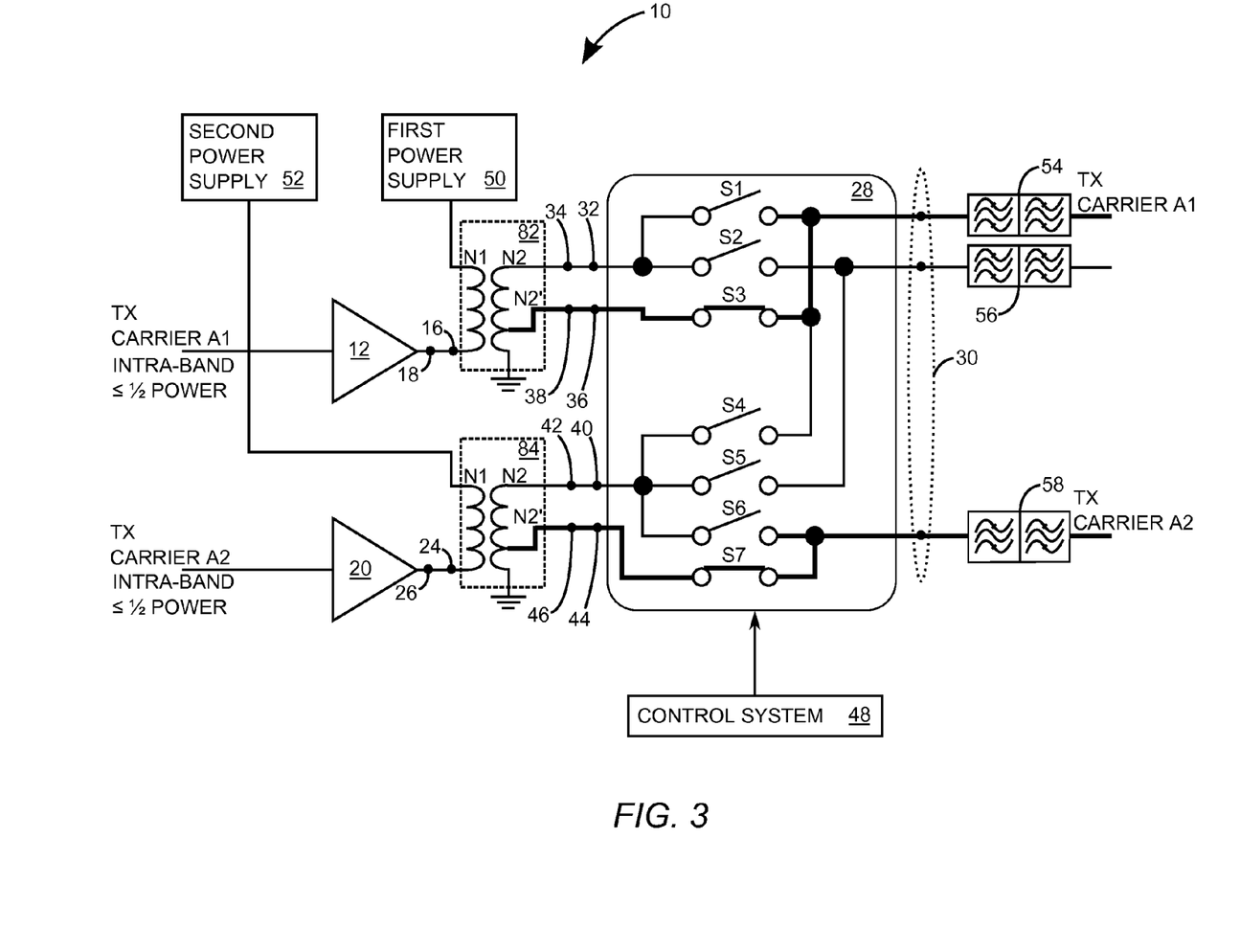
FIG. 3 is a schematic of the efficient power transfer PA architecture wherein the first ITN comprises a first tapped transformer and the second ITN comprises a second tapped transformer.

FIG. 3 is a schematic of the efficient power transfer PA architecture 10 wherein the first ITN 14 (FIG. 1) comprises a first tapped transformer 82 and the second ITN 22 (FIG. 1) comprises a second tapped transformer 84. When connecting only one of the first PA 12 and the second PA 20 to an individual load, such as during operation of a UL CA non-contiguous mode, impedance presented to the first PA 12 and the second PA 20 through the first tapped transformer 82 and the second tapped transformer 84, respectively, is $Z_{load}/(N2/N1)^2$. This relationship corresponds to a maximum power rating $P_{max}$ for either the first PA 12 or the second PA 20. In this case, the turns ratio needs to be reduced by a factor of $\sqrt{2}$ (i.e., $N2'=N2/\sqrt{2}$) so the impedance seen by the first PA 12 and the second PA 20, respectively, is doubled. Thus, the power delivered from either the first PA 12 or the second PA 20, is $P_{max}/2$.

Figure 4:
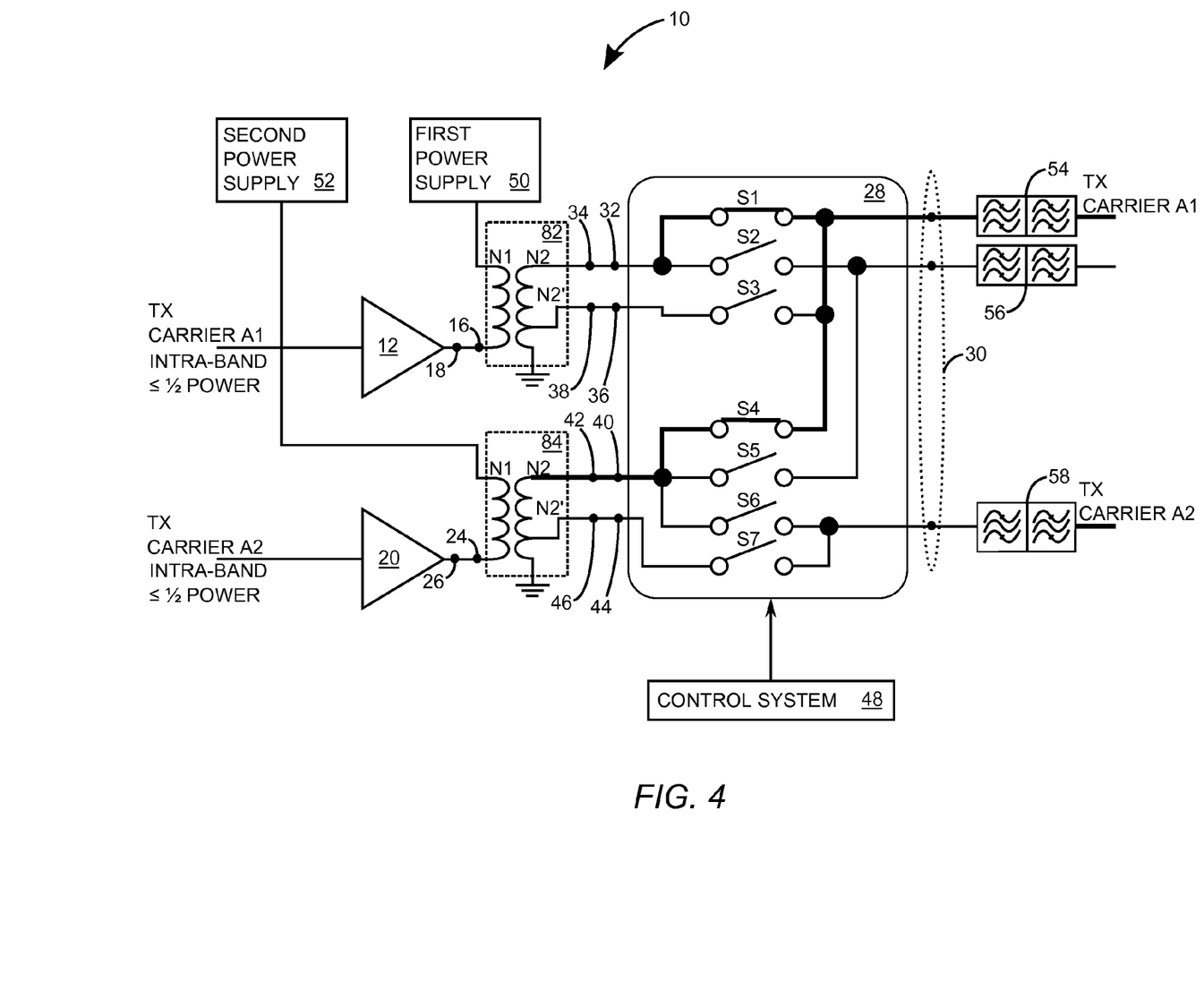
FIG. 4 is a schematic of the efficient power transfer PA architecture wherein outputs of the first PA and the second PA are connected in parallel during either a non-carrier aggregation (non-CA) or an uplink (UL) CA intra-band contiguous mode.

FIG. 4 is a schematic of the efficient power transfer PA architecture 10 wherein outputs of the first PA 12 and the second PA 20 are connected in parallel during either a non-CA mode or a UL CA intra-band contiguous mode. As a result, the impedance presented to each of the first PA 12 and the second PA 20 through each the first tapped transformer 82 and the second tapped transformer 84 is equal to $2*Z_{load}/(N2/N1)^2$, where $Z_{load}$ is in this case an input impedance at either the first duplexer 54 or the third duplexer 58, and N1 and N2 are turns ratios for secondary and primary transformer windings for each of the first tapped transformer 82 and the second tapped transformer 84. As a result, the first PA 12 and the second PA 20 see an impedance that is doubled to reduce the power demand on each of the first PA 12 and the second PA 20 by 3 dB. However, a total power experienced by a load remains maximized. Thus, parallel transformer coupled outputs allow the first PA 12 and the second PA 20 to equally contribute to the total power experienced by a load. As a result, the first PA 12 and the second PA 20 are each half the size of a single PA sized to deliver the total power experienced by the load. Moreover, the first power supply 50 and the second power supply 52 are each half the size of a single power supply that sources the same amount of power deliverable to the first PA 12 and the second PA 20. Further still, the switches S1-S7 making up the switching network 28 are each rated to switch half of a total power and each are half the size of switches through which the total power is deliverable. Note that this balance in power contribution between the first PA 12 and the second PA 20 occurs without modifying the turns ratio N1:N2 for either the first tapped transformer 82 or the second tapped transformer 84.

Figure 5:
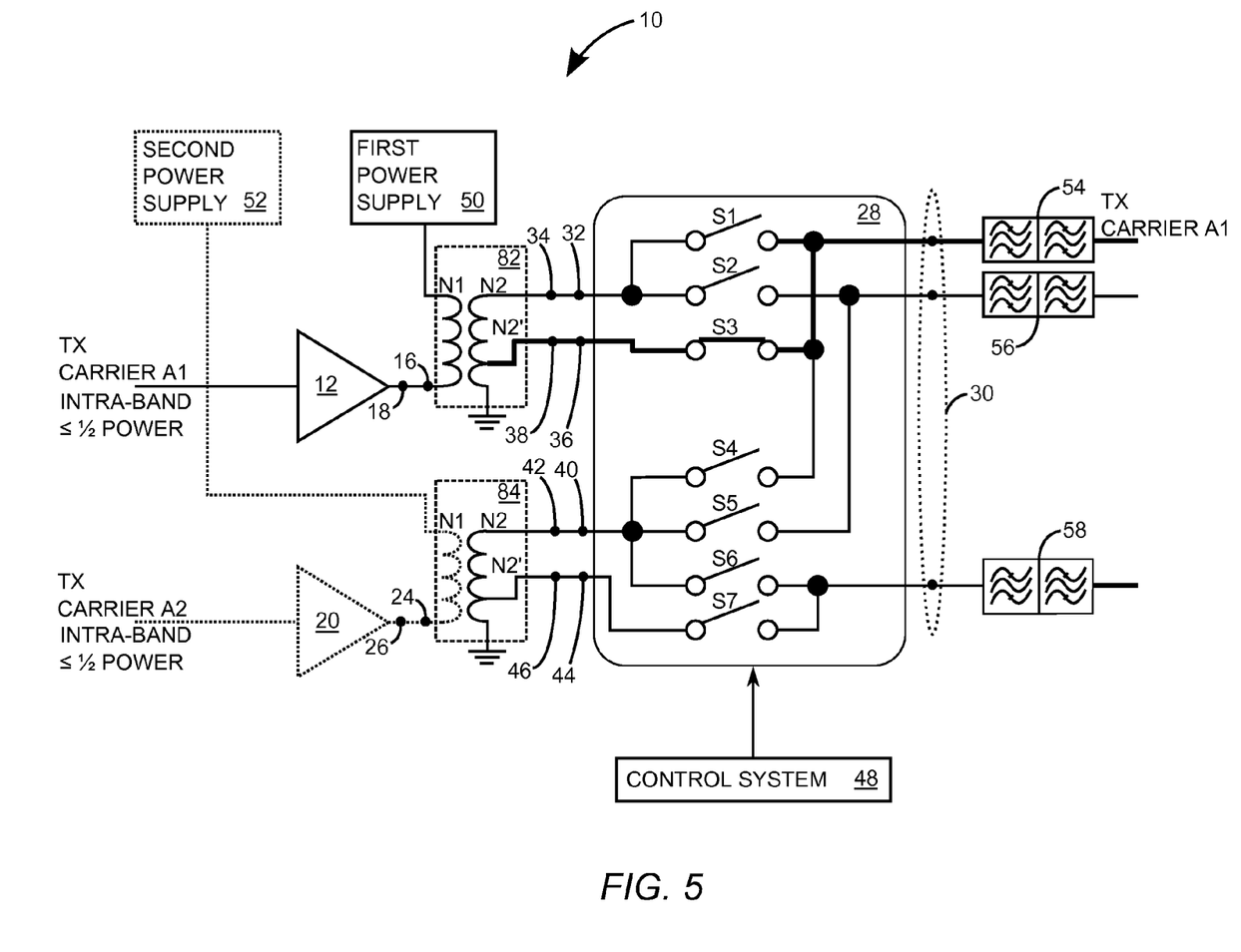
FIG. 5 is a schematic of the efficient power transfer PA architecture when output power is reduced by 3 dB from a maximum output power during a non-CA UL mode of operation.

FIG. 5 is a schematic of the efficient power transfer PA architecture 10 during a reduced power non-CA UL operation. In this case, the second PA 20, the second power supply 52, and the second tapped transformer 84 are deactivated and are shown in thin dashed lines in FIG. 5. As a result of the deactivation, output power is reduced by 3 dB from a maximum output power. Moreover, parasitic losses attributable to the second PA 20, the second power supply 52, and the second tapped transformer 84 are nonexistent during the reduced power non-CA UL operation.

Figure 6:
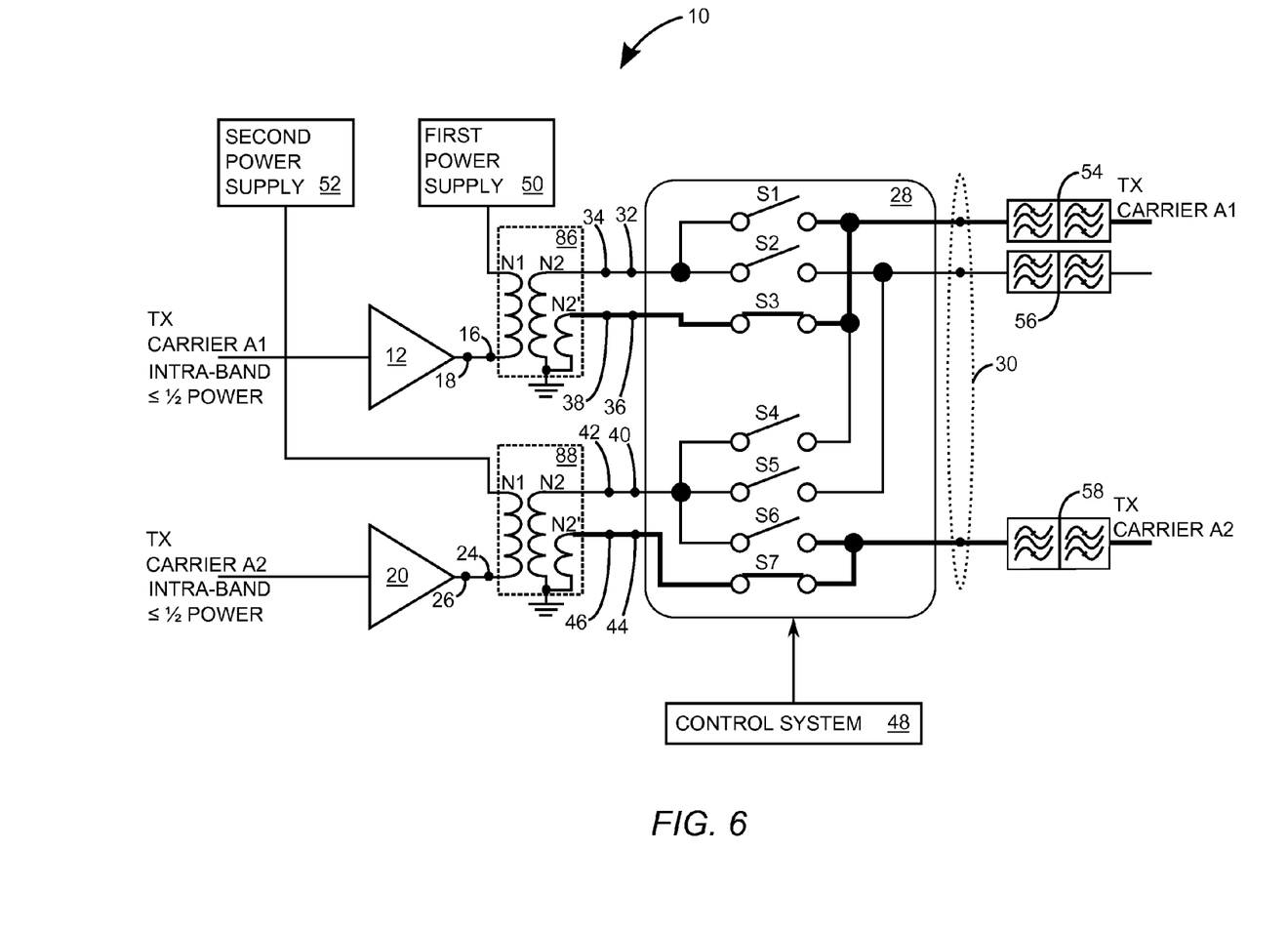
FIG. 6 is a schematic of the efficient power transfer PA architecture where the first ITN comprises a first dual secondary transformer and the second ITN comprises a second dual secondary transformer.

FIG. 6 is a schematic of the efficient power transfer PA architecture 10 where the first ITN 14 (FIG. 1) comprises a first dual secondary transformer 86 and the second ITN 22 (FIG. 1) comprises a second dual secondary transformer 88. Similar to the embodiment of FIG. 4, the impedance presented to each of the first PA 12 and the second PA 20 through each of the first dual secondary transformer 86 and the second dual secondary transformer 88 is equal to $2*Z_{load}/(N2/N1)^2$.

Figure 7:
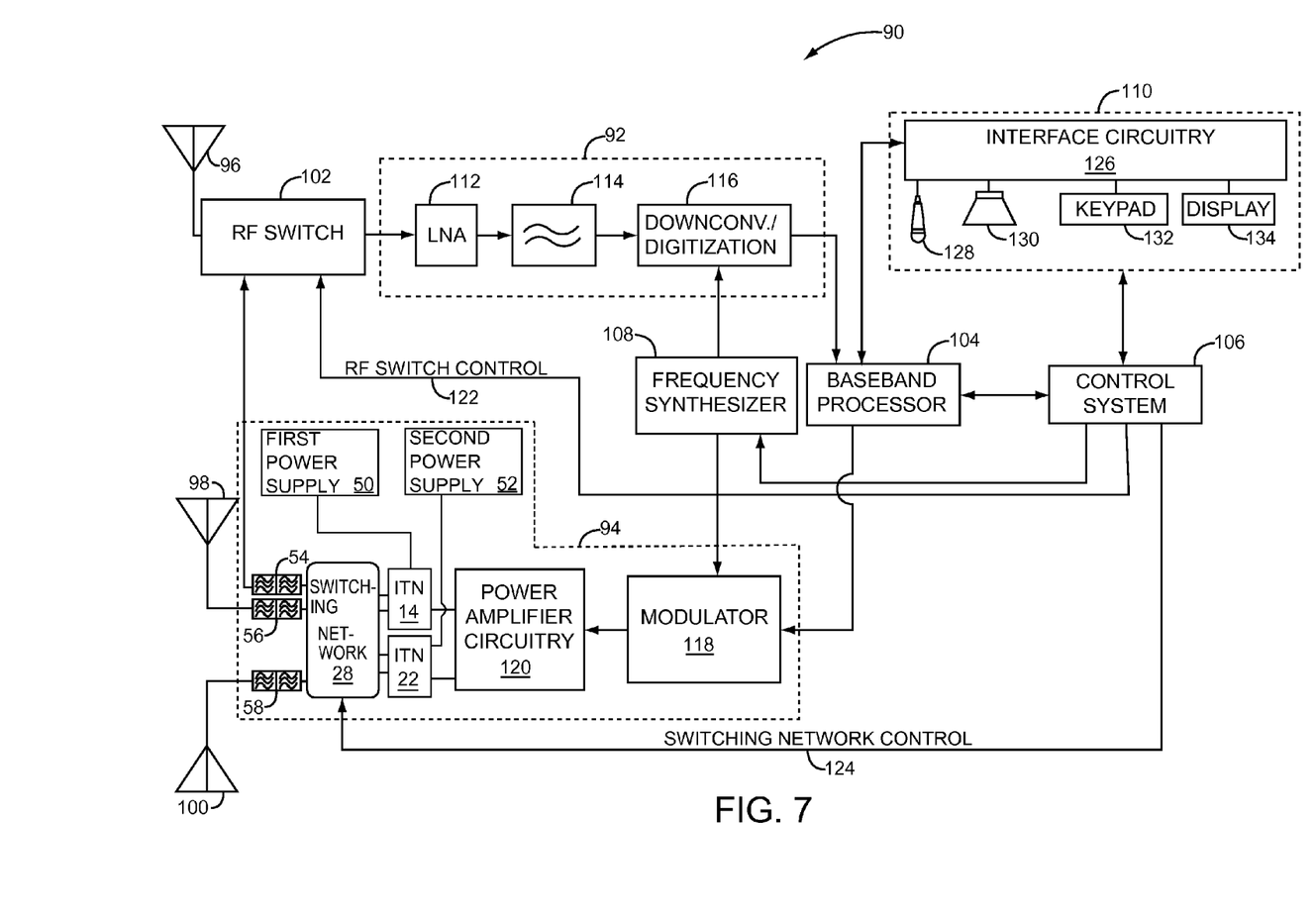
FIG. 7 is a block diagram of a mobile terminal that incorporates the efficient power transfer PA architecture of the present disclosure.

Turning now to FIG. 7, a preferred embodiment of the present disclosure is incorporated in a mobile terminal 90, such as a mobile telephone, a personal digital assistant (PDA), tablet, or the like. The basic architecture of the mobile terminal 90 may include a receiver front end 92, an RF transmitter section 94, a first antenna 96, a second antenna 98, a third antenna 100, an RF switch 102, a baseband processor 104, a control system 106, a frequency synthesizer 108, and an interface 110. The RF transmitter section 94 incorporates the efficient power transfer PA architecture 10 (FIG. 1) with the exception that the control system 48 (FIG. 1) is integrated into the control system 106.

The receiver front end 92 receives information bearing RF signals from one or more remote transmitters provided by a base station. A low noise PA 112 amplifies the signal. A filter circuit 114 minimizes broadband interference in the received signal, while downconversion and digitization circuitry 116 downconverts the filtered, received signal to an intermediate or baseband frequency signal, which is then digitized into one or more digital streams. The receiver front end 92 typically uses one or more mixing frequencies generated by the frequency synthesizer 108.

The baseband processor 104 processes the digitized received signal to extract the information or data bits conveyed in the received signal. This processing typically comprises demodulation, decoding, and error correction operations. As such, the baseband processor 104 is generally implemented in one or more digital signal processors (DSPs).

On the transmit side, the baseband processor 104 receives digitized data, which may represent voice, data, or control information, from the control system 106, which it encodes for transmission. The encoded data is output to the RF transmitter section 94, where it is used by a modulator 118 to modulate a carrier signal that is at a desired transmit frequency. Power amplifier (PA) circuitry 120 that includes the first PA 12 (FIG. 1), and the second PA 20 (FIG. 1) amplifies the modulated carrier signal to a level appropriate for transmission from either the first antenna 96, the second antenna 98, or the third antenna 100 or combinations thereof.

The amplified signal is selectively sent to the first antenna 96, the second antenna 98, the third antenna 100, or combinations thereof. The control system 106 is adapted to provide an RF switch control 122 for activating switch throws of the RF switch 102. The control system 106 is further adapted to provide a switching network control 124 for activating switches S1-S7 (FIG. 1) of the switching network 28.

A user may interact with the mobile terminal 90 via the interface 110, which may include interface circuitry 126 associated with a microphone 128, a speaker 130, a keypad 132, and a display 134. The interface circuitry 126 typically includes analog-to-digital converters, digital-to-analog converters, PAs, and the like. Additionally, it may include a voice encoder/decoder, in which case it may communicate directly with the baseband processor 104. The microphone 128 will typically convert audio input, such as the user's voice, into an electrical signal, which is then digitized and passed directly or indirectly to the baseband processor 104. Audio information encoded in the received signal is recovered by the baseband processor 104, and converted into an analog signal suitable for driving the speaker 130 via the interface circuitry 126. The keypad 132 and the display 134 enable the user to interact with the mobile terminal 90, inputting numbers to be dialed, address book information, or the like, as well as monitoring call progress information.

Figure 8:
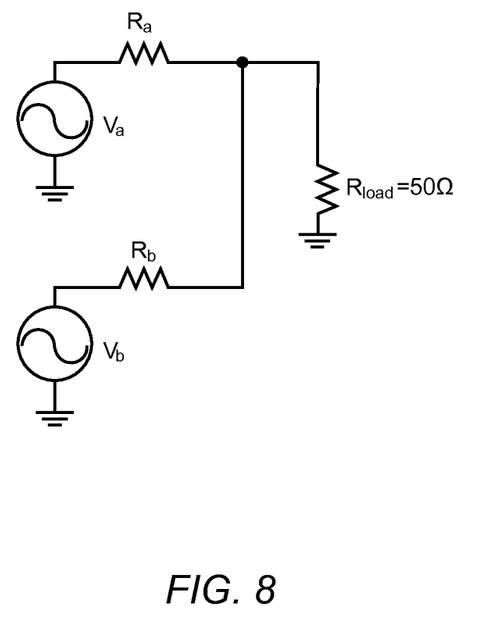
FIG. 8 is a schematic of a circuit model that demonstrates how power from two in-phase signals can be combined without using transformers such as the first dual secondary transformer of FIG. 6.

FIG. 8 is a schematic of a circuit model that demonstrates how power from two in-phase signals can be combined without using transformers such as the first dual secondary transformer 86 (FIG. 3). Therefore, the first ITN 14 (FIG. 1) and the second ITN 22 (FIG. 1) as well as the first PITN 62 (FIG. 2) and the second PITN 66 (FIG. 2) can be transformerless. Notice that if $R_a = R_{load}$ and only one source $V_a$ or $V_b$ is active $V_{load} = \frac{1}{2}(V_a)$ and $$P_{load} = \frac{V_a^2}{4R_{load}}. \tag{EQ. 1}$$

However, if sources $V_a$ or $V_b$ are both active the following relationship for $V_{load}$ is derived by using superposition:

$$V_{load} = \frac{\frac{R_a R_{load}}{R_a + R_{load}}}{\frac{R_a R_{load}}{R_a + R_{load}} + R_b} V_b + \frac{\frac{R_b R_{load}}{R_b + R_{load}}}{\frac{R_b R_{load}}{R_b + R_{load}} + R_a} V_a = \quad \text{(EQ. 2)}$$

$$\frac{R_a R_{load}}{R_a R_{load} + R_b (R_a + R_{load})} V_b + \frac{R_b R_{load}}{R_b R_{load} + R_a (R_b + R_{load})} V_a$$

Moreover, the following relationship for $V_{load}$ is realized assuming that signals are output in-phase from the first PA 12 (FIGS. 1-6) and the second PA 20 (FIGS. 1-6) that have equal output impedances.

$$V_{load} = \frac{2R_{load}}{2R_{load} + R} V \quad \text{(EQ. 3)}$$

Further still, if $R_a = R_b = R = 2R_{load}$ output voltage and power associated with $R_{load}$ will occur as if $R_{load}$ was driven from a single source with an output impedance equal to $R_{load}$. Therefore, if the two sources $V_a$ and $V_b$ are tied together, the output impedance of each of the first PA 12 and the second PA 20 needs to be twice as large as $R_{load}$. Thus, this result is equivalent to using the first dual secondary transformer 86 (FIG. 6) and the second dual secondary transformer 88 (FIG. 6) wherein a turns ratio for each is set to 1× with two outputs connected in parallel. If the two sources $V_a$ and $V_b$ drive independent loads then the turns ratio is reduced by a factor of $\sqrt{2}$.

Those skilled in the art will recognize improvements and modifications to the embodiments of the present disclosure. All such improvements and modifications are considered within the scope of the concepts disclosed herein and the claims that follow.

What is claimed is:

1. An efficient power transfer power amplifier (PA) architecture comprising:
   a first PA;
   a first impedance transformation network (ITN) having an input coupled to an output of the first PA;
   a second PA;
   a second ITN having an input coupled to an output of the second PA;
   a switching network comprising;
      a plurality of load outputs;
      a first switch input coupled to a first impedance output of the first ITN;
      a second switch input coupled to a second impedance output of the first ITN;
      a third switch input coupled to a third impedance output of the second ITN; and
      a fourth switch input coupled to a fourth impedance output of the second ITN; and
   a control system adapted to control the switching network in response to a selected mode to switch signals arriving at the first switch input, the second switch input, the third switch input, and the fourth switch input such that select ones of the signals travel paths having matching impedances to loads coupled to select ones of the plurality of load outputs.

2. The efficient power transfer PA architecture of claim 1 wherein the switching network couples outputs from the first ITN and the second ITN together so that outputs of the first PA and the second PA are connected in parallel during a non-carrier aggregation (non-CA) mode.

3. The efficient power transfer PA architecture of claim 1 wherein the switching network couples outputs from the first ITN and the second ITN together so that outputs of the first PA and the second PA are not connected in parallel in order to drive separate loads during an uplink (UL) CA intra-band contiguous mode.

4. The efficient power transfer PA architecture of claim 1 further including a first power supply to power the first PA and a second power supply to power the second PA.

5. The efficient power transfer PA architecture of claim 1 wherein the first power supply outputs power to the first PA via the first ITN, and the second power supply outputs power to the second PA via the second ITN.

6. The efficient power transfer PA architecture of claim 4 wherein the first power supply and the second power supply are each a fast switched-mode power supply (Fast SMPS) type used in envelope tracking systems (ETS).

7. The efficient power transfer PA architecture of claim 4 wherein the first power supply and the second power supply are each an average power tracking (APT) type power supply that change DC supply levels during each power control slot time for long term evolution (LTE) signals.

8. The efficient power transfer PA architecture of claim 4 wherein during a non-CA UL mode output power is reduced by 3 dB from a maximum output power by deactivating either the first PA and the first power supply or the second PA and the second power supply.

9. The efficient power transfer PA architecture of claim 4 wherein the first power supply and the second power supply equally share delivering a total power and are each half the size of a single power supply for delivering an equal amount of total power.

10. The efficient power transfer PA architecture of claim 9 wherein the first PA and the second PA are each half the size of a single PA for delivering the same amount of power as a combined output of the first PA and the second PA.

11. The efficient power transfer PA architecture of claim 10 wherein the switching network includes switches that are each rated to switch half of a total power and each are half the size of switches through which the total power is deliverable.

12. The efficient power transfer PA architecture of claim 1 wherein the first ITN and the second ITN each comprise a transformerless network configured from inductors and capacitors.

13. The efficient power transfer PA architecture of claim 1 wherein the first ITN and the second ITN each comprise a tapped transformer.

14. The efficient power transfer PA architecture of claim 1 wherein the first ITN and the second ITN each comprise a dual secondary transformer.

15. An efficient power transfer power amplifier (PA) architecture comprising:
   a first PA;
   a first programmable impedance transformation network (PITN) having an input coupled to an output of the first PA;
   a second PA;
   a second PITN having an input coupled to an output of the second PA;
   a switching network comprising;
      a plurality of load outputs;
      a first switch input coupled to an impedance output of the first PITN;
      a second switch input coupled to an impedance output of the second PITN; and
   a control system adapted to control the switching network in response to a selected mode to switch signals arriving at the first switch input and the second switch input to select ones of the plurality of load outputs, and to control programmable impedances of the first PITN and the second PITN such that select ones of the signals travel paths having matching impedances to loads coupled to select ones of the plurality of load outputs.

16. The efficient power transfer PA architecture of claim 15 wherein the switching network couples outputs from the first PITN and the second PITN together so that outputs of the first PA and the second PA are connected in parallel during a non-carrier aggregation (non-CA) mode.

17. The efficient power transfer PA architecture of claim 15 wherein the switching network couples outputs from the first PITN and the second PITN together so that outputs of the first PA and the second PA are not connected in parallel in order to drive separate loads during an uplink (UL) CA intra-band contiguous mode.

18. The efficient power transfer PA architecture of claim 15 further including a first power supply to power the first PA and a second power supply to power the second PA.

19. The efficient power transfer PA architecture of claim 18 wherein during a non-CA UL mode output power is reduced by 3 dB from a maximum output power by deactivating either the first PA and the first power supply or the second PA and the second power supply.

20. The efficient power transfer PA architecture of claim 18 wherein the first power supply and the second power supply equally share delivering a total power and are each half the size of a single power supply for delivering an equal amount of total power.

21. The efficient power transfer PA architecture of claim 20 wherein the first PA and the second PA are half the size of a single PA for delivering the same amount of power as a combined output of the first PA and the second PA.

22. The efficient power transfer PA architecture of claim 21 wherein the switching network includes switches that are each rated to switch half of a total power and each are half the size of switches through which the total power is deliverable.

23. The efficient power transfer PA architecture of claim 18 wherein the first power supply outputs power to the first PA via the first PITN, and the second power supply outputs power to the second PA via the second PITN.

24. The efficient power transfer PA architecture of claim 18 wherein the first power supply and the second power supply are each a fast switched-mode power supply (Fast SMPS) type used in envelope tracking systems (ETS).

25. The efficient power transfer PA architecture of claim 18 wherein the first power supply and the second power supply are each an average power tracking (APT) type power supply that change DC supply levels during each power control slot time for long term evolution (LTE) signals.

26. The efficient power transfer PA architecture of claim 15 wherein the first PITN and the second PITN each comprise a transformerless network configured from inductors and capacitors.

* * * * *